US010637699B2

(12) United States Patent
Iijima et al.

(10) Patent No.: US 10,637,699 B2
(45) Date of Patent: Apr. 28, 2020

(54) DATA CARRIER APPARATUS, DATA CARRIER DRIVE APPARATUS, COMMUNICATION SYSTEM AND REPLACEABLE PART OF IMAGE FORMING APPARATUS

(71) Applicant: CANON KABUSHIKI KAISHA, Tokyo (JP)

(72) Inventors: Ichiro Iijima, Yokohama (JP); Hirotaka Ittogi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/193,014

(22) Filed: Nov. 16, 2018

(65) Prior Publication Data

US 2019/0165974 A1     May 30, 2019

(30) Foreign Application Priority Data

Nov. 29, 2017   (JP) ................................ 2017-229360
Sep. 19, 2018   (JP) ................................ 2018-175339

(51) Int. Cl.
*H04L 27/156*     (2006.01)
*H03K 9/08*       (2006.01)
*H04L 25/49*      (2006.01)

(52) U.S. Cl.
CPC .......... *H04L 27/1563* (2013.01); *H03K 9/08* (2013.01); *H04L 25/4902* (2013.01)

(58) Field of Classification Search
CPC .................................................. H04L 27/1563
USPC ........................................................ 375/225
See application file for complete search history.

(56) References Cited

U.S. PATENT DOCUMENTS

| 5,166,699 | A | * | 11/1992 | Yano ................... B41J 2/16579 347/14 |
| 2006/0098691 | A1 | | 5/2006 | Yamazaki |
| 2014/0169443 | A1 | * | 6/2014 | Karino ............... H04L 25/4902 375/238 |
| 2018/0316485 | A1 | | 11/2018 | Ittogi et al. |

FOREIGN PATENT DOCUMENTS

JP     4393351 B2    1/2010

* cited by examiner

*Primary Examiner* — Michael R Neff
(74) *Attorney, Agent, or Firm* — Venable LLP (57) ABSTRACT

A data carrier apparatus includes a duty detector configured to determine a duty ratio of each pulse of a pulse signal that is received, a frequency detector configured to determine a period of each pulse of the pulse signal, and a demodulator configured to determine a value of data being carried by the pulse signal based on a determination result of the duty detector unit and a determination result of the frequency detector.

17 Claims, 12 Drawing Sheets

DATA CARRIER APPARATUS, DATA CARRIER DRIVE APPARATUS, COMMUNICATION SYSTEM AND REPLACEABLE PART OF IMAGE FORMING APPARATUS

BACKGROUND OF THE INVENTION

Field of the Invention

The present invention relates to a data carrier apparatus and a data carrier drive apparatus that transmit and receive data, and to a communication system and an image forming apparatus that include the data carrier apparatus and the data carrier drive apparatus.

Description of the Related Art

US-2006-098691 discloses a communication system that transmits and receives data, supplies power and supplies a synchronous signal through two communication lines. According to US-2006-098691, the data carrier drive apparatus transmits data to the data carrier apparatus by changing a duty ratio of a pulse signal according to a data value. On the other hand, the data carrier apparatus, in a period in which the pulse signal output by the data carrier drive apparatus is high level, transmits data to the data carrier drive apparatus by changing the current that flows through the communication lines according to the data value. The data communication system of US-2006-098691 transmits and receives 1-bit data in one cycle of the pulse signal that is output by the data carrier drive apparatus.

In such a communication system, one method for increasing the communication rate is to increase the frequency of the pulse signal. However, such a communication system requires an increase in the load capacity of a drive circuit in order to superimpose and transmit signals and power. Rounding occurs on the rising edge and the falling edge of the pulse signal of a drive circuit with a large load capacity. For this reason, there is a limit to how much the frequency of a pulse signal can be increased.

SUMMARY OF THE INVENTION

According to an aspect of the present invention, a data carrier apparatus includes: a first determination unit configured to determine a duty ratio of each pulse of a pulse signal that is received; a second determination unit configured to determine a period of each pulse of the pulse signal; and a third determination unit configured to determine a value of data being carried by the pulse signal based on a determination result of the first determination unit and a determination result of the second determination unit.

Further features of the present invention will become apparent from the following description of exemplary embodiments with reference to the attached drawings.

DESCRIPTION OF THE EMBODIMENTS

The following describes illustrative embodiments of the present invention with reference to the drawings. Note that the following embodiments are illustrative, and the present invention is not limited to the contents of the embodiments. Also, in regards to the drawings, descriptions of constituent elements that are not necessary for the description of the embodiments are omitted from the drawings.

First Embodiment

Figure 1:
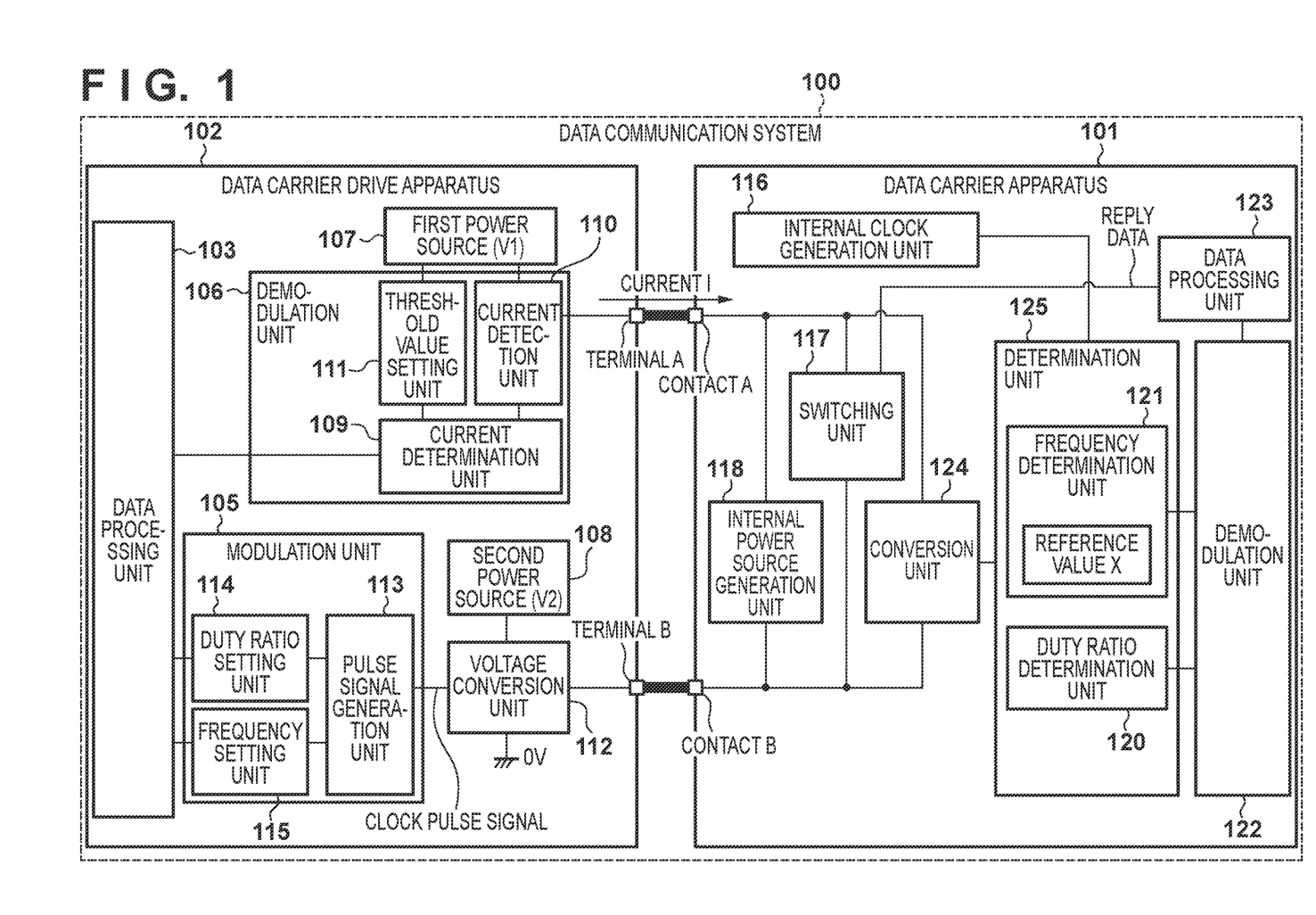
FIG. 1 is a configuration diagram of a data communication system according to one embodiment.

FIG. 1 is a configuration diagram of a data communication system 100 according to the present embodiment. The data communication system 100 has a data carrier apparatus 101 and a data carrier drive apparatus 102. The data carrier drive apparatus 102 has a terminal A and a terminal B, and the data carrier apparatus 101 has a contact A and a contact B. Here, as shown in FIG. 1, the terminal A and the contact A are connected by a communication line, the terminal B and the contact B are connected by a communication line, and the transmission and reception of data between the data carrier apparatus 101 and the data carrier drive apparatus 102 is performed via these two communication lines. Also, the data carrier drive apparatus 102 supplies drive power to the data carrier apparatus 101 via these two communication lines.

For example, the data communication system 100 according to the present embodiment can be applied to an image forming apparatus. Specifically, the data carrier drive apparatus 102 is provided in the body of the image forming apparatus, and the data carrier apparatus 101 is provided in a replaceable unit of the image forming apparatus. The image forming apparatus is configured such that the data carrier drive apparatus 102 and the data carrier apparatus 101 are connected by the two communication lines when the replaceable unit is mounted to the image forming apparatus. Also, a memory (not shown) that stores information related to the replaceable unit is provided in the data carrier apparatus 101. Thus, the image forming apparatus can use the data communication system 100 to acquire information stored in the memory that is related to the replaceable unit. Note that information stored in the memory can be, for example, information related to authentication of the replaceable unit, information related to control parameters of image forming control that is performed with use of the replaceable unit, and the like.

Figure 2:
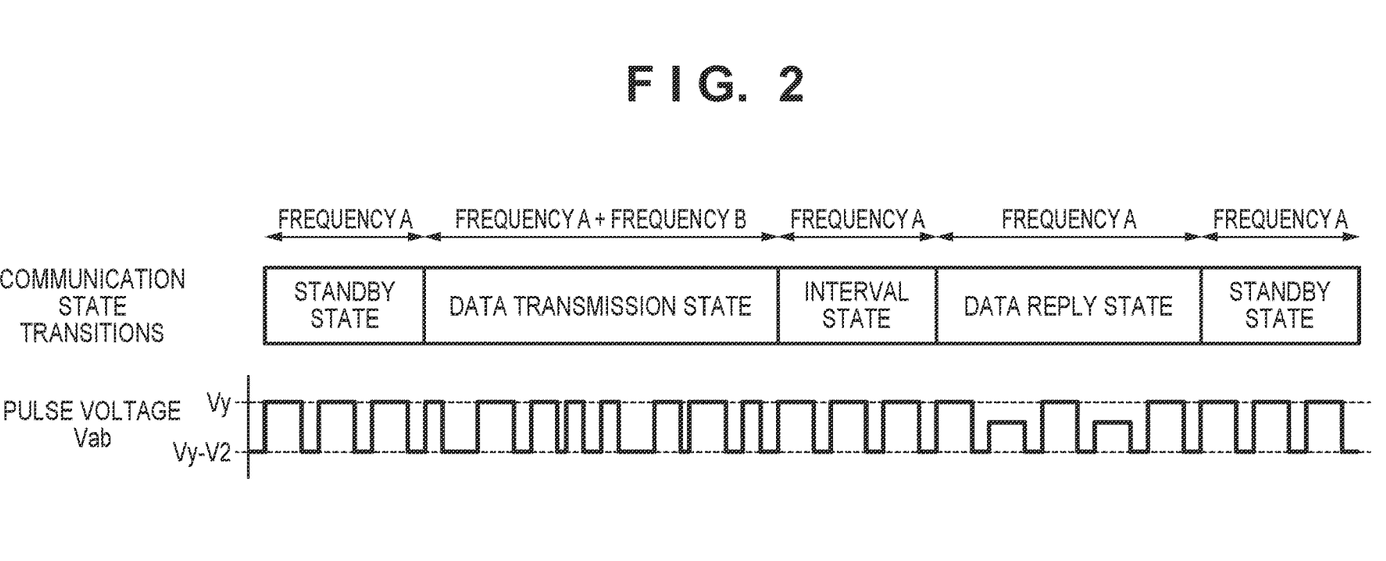
FIG. 2 is an illustrative diagram of the transition of communication states according to one embodiment.

As shown in FIG. 2, the data communication system 100 according to the present embodiment transmits and receives data while transitioning between four communication states, namely, a standby state, a data transmission state, an interval state and a data reply state, in that order. In the data transmission state, the data carrier drive apparatus 102 transmits command data to the data carrier apparatus 101. For example, the data carrier drive apparatus 102, according to the command data, instructs the data carrier apparatus 101 to read out data stored in the memory (not shown) of the data carrier apparatus 101. In the interval state, the data carrier apparatus 101 analyses the command received in the data transmission state and executes the command. In the data reply state, the data carrier apparatus 101 transmits reply data to the data carrier drive apparatus 102, as a response to the command received from the data carrier drive apparatus 102 in the data transmission state. For example, in a case where the command received in the data transmission state is a command for reading out data from the memory, the reply will be a data value stored in the memory. The communication system transitions to the standby state once the data reply state ends. The standby state lasts until the data carrier drive apparatus 102 transmits the next command data to the data carrier apparatus 101.

First, the data carrier drive apparatus 102 of FIG. 1 will be described. The data carrier drive apparatus 102 has a first power source 107 that outputs a voltage V1, and a second power source 108 that outputs a voltage V2 that is lower than the voltage V1. The first power source 107 outputs the voltage V1 to a threshold value setting unit 111 and a current detection unit 110 of a demodulation unit 106. The second power source 108 outputs the voltage V2 to a voltage conversion unit 112. A data processing unit 103 creates command data that is to be transmitted to the data carrier apparatus 101, and executes processing that is based on the reply data received from the data carrier apparatus 101.

A modulation unit 105 generates a clock pulse signal in accordance with the command data generated by the data processing unit 103. Specifically, values that show the two duty ratios, namely, a duty A and a duty B, are stored in a duty ratio setting unit 114. In the present embodiment, it is assumed that a value showing the duty A as a duty ratio that is lower than 50%, and a value showing the duty B as a duty ratio that is higher than 50% are stored. The duty ratio setting unit 114 selects the duty A or the duty B according to the data value of the command data, and notifies the selected duty ratio to a pulse signal generation unit 113. Also, values that show two frequencies, namely a frequency A and a frequency B, are stored in a frequency setting unit 115. In the present embodiment, the frequency B is a higher frequency than the frequency A. The frequency setting unit 115 selects the frequency A or the frequency B according to the data value of the command data, and notifies a value that shows the selected frequency to the pulse signal generation unit 113. The pulse signal generation unit 113 generates a clock pulse signal that includes a pulse based on the duty ratio and frequency respectively selected by the duty ratio setting unit 114 and the frequency setting unit 115, and outputs the clock pulse signal to the voltage conversion unit 112. In other words, the pulse of the clock pulse signal that is output by the pulse signal generation unit 113 is one of four types of pulses, namely, the pulse of the duty A at the frequency A, the pulse of the duty A at the frequency B, the pulse of the duty B at the frequency A or the pulse of the duty B at the frequency B.

Figure 3:
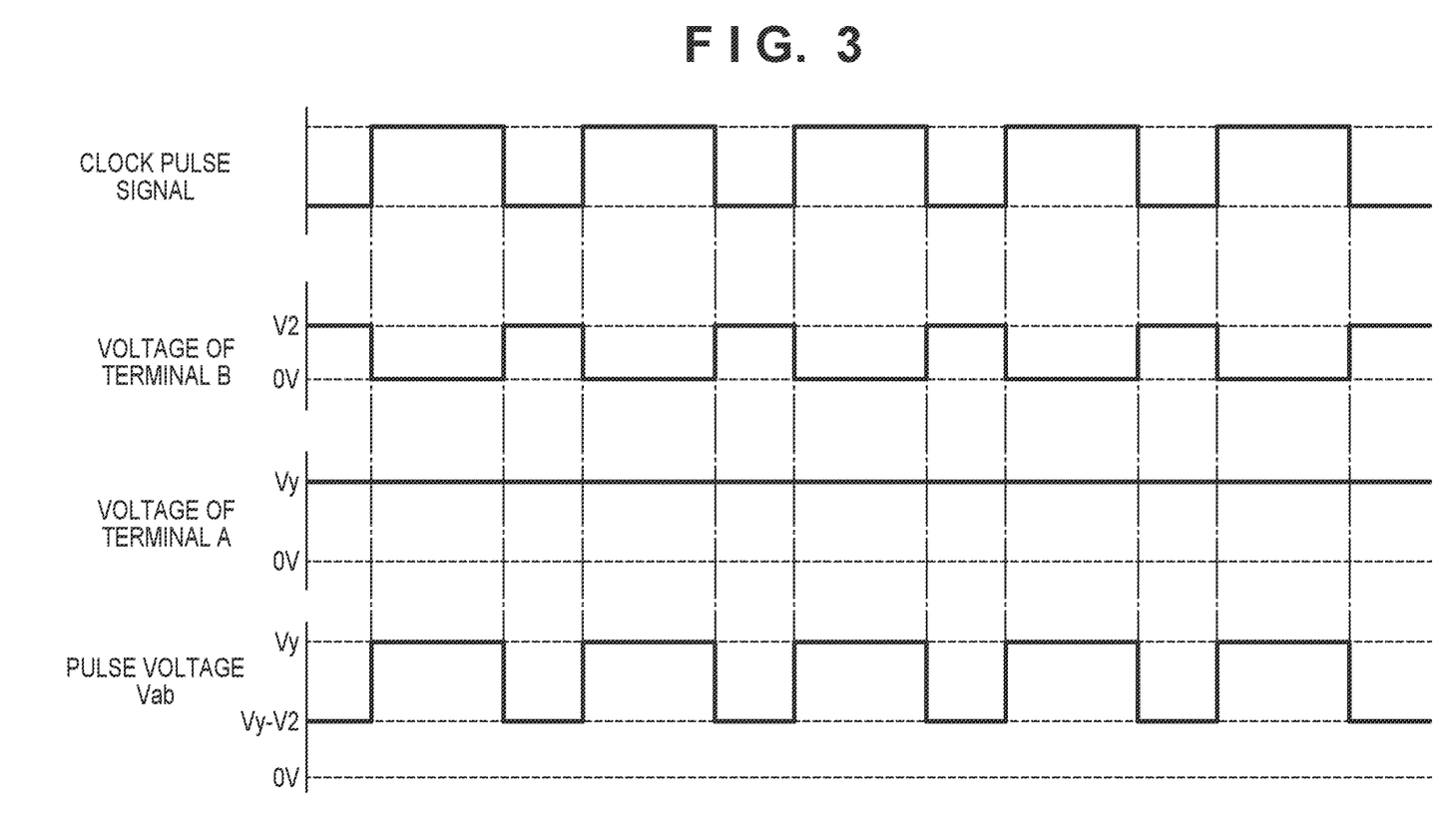
FIG. 3 is a diagram showing signal waveforms according to one embodiment.

The voltage conversion unit 112 outputs the voltage V2 that is output by the second power source 108 to the terminal B in a period in which the level of the input clock pulse signal is low, and outputs 0V (GND) to the terminal B in a period in which the signal level is high. For example, when the clock pulse shown in FIG. 3 is input to the voltage conversion unit 112, the voltage conversion unit 112 outputs the voltage waveform shown in FIG. 3 to the terminal B.

Figure 4:
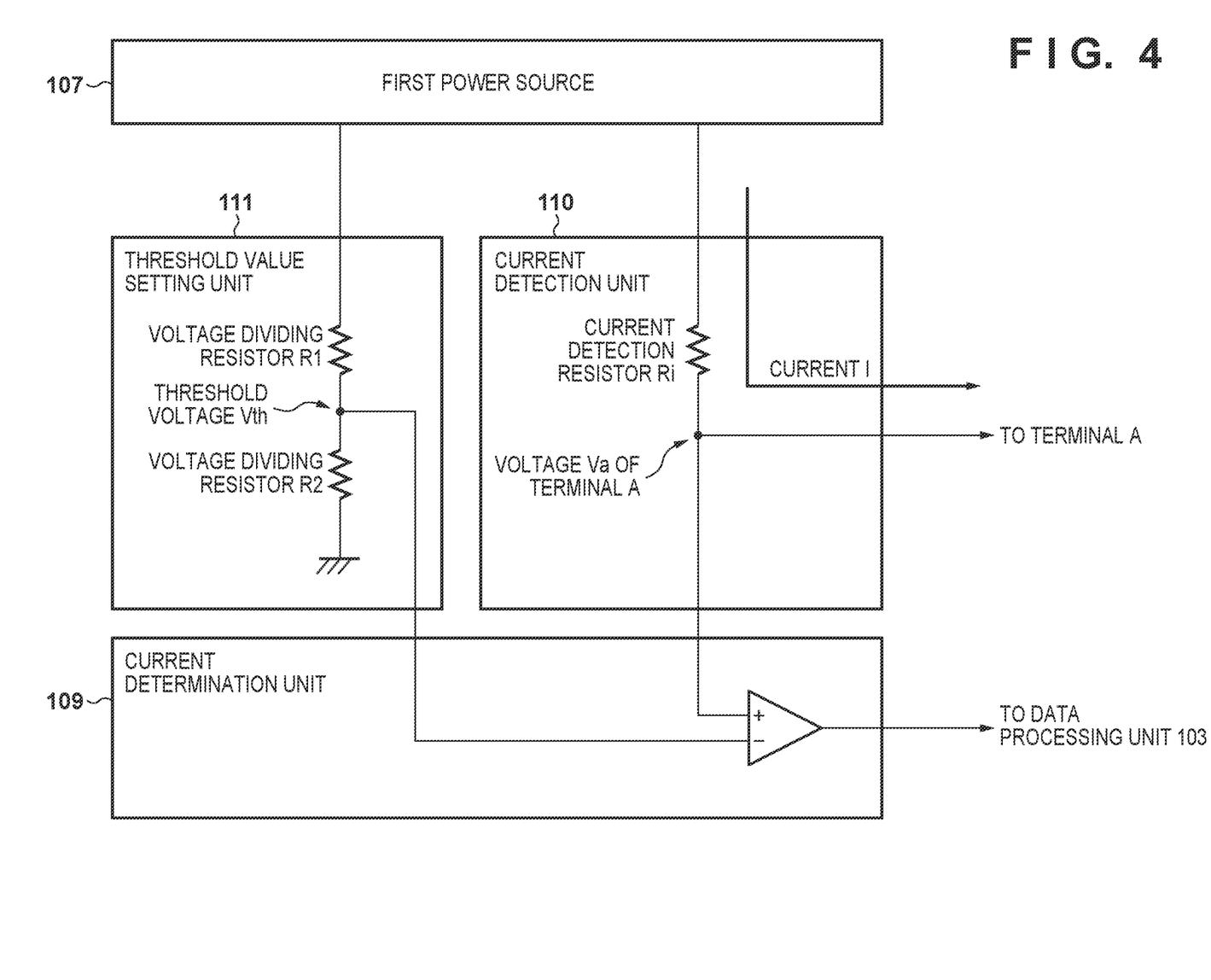
FIG. 4 is a configuration diagram of a demodulation unit of a data carrier drive apparatus according to one embodiment.

The demodulation unit 106 demodulates reply data that is transmitted by the data carrier apparatus 101 and outputs the resultant data to the data processing unit 103. FIG. 4 shows a detailed configuration of the demodulation unit 106. The current detection unit 110 has a current detection resistor Ri. If Iy is the value of a current I that flows out from the first power source 107 to the data carrier apparatus 101, a voltage Va of the contact A (the terminal A) of the data carrier apparatus 101 will be Vy=(V1−Iy×Ri). The threshold value setting unit 111 has a voltage dividing resistor R1 and a voltage dividing resistor R2, divides the voltage V1 that is output by the first power source 107 with the voltage dividing resistors R1 and R2, and generates a threshold voltage Vth. The threshold voltage Vth and the voltage Va of the terminal A are input to a comparator of a current determination unit 109, and by comparing the magnitudes of the voltages, determines the magnitude of the voltage drop from the current I and outputs the result of that determination.

Note that, as will be described later, in the present embodiment it is the data carrier apparatus 101 that changes the value of the current I. Specifically, the data carrier apparatus 101 sets the value of the current I to Iy, in communication states other than the data reply state. Also, the data carrier apparatus 101 sets the value of the current I to Iy or to Ix which is greater than Iy, in the data reply state according to the data value of the reply data. In the following, the voltage Va is set to Vy when the current I is Iy, and the voltage Va is set to Vx (<Vy) when the current I is Ix. Note that Vx>V2. FIG. 3 also shows the voltage of the terminal A when the current I is Iy, and a pulse voltage Vab, which is the potential difference between the terminal A and the terminal B. As shown in FIG. 3, if the current I is Iy, the pulse voltage Vab will be a pulse waveform in which the high level is roughly Vy and the low level is roughly Vy−V2. The pulse voltage Vab is supplied to the data carrier apparatus 101 via the contact A and the contact B.

Figure 5:
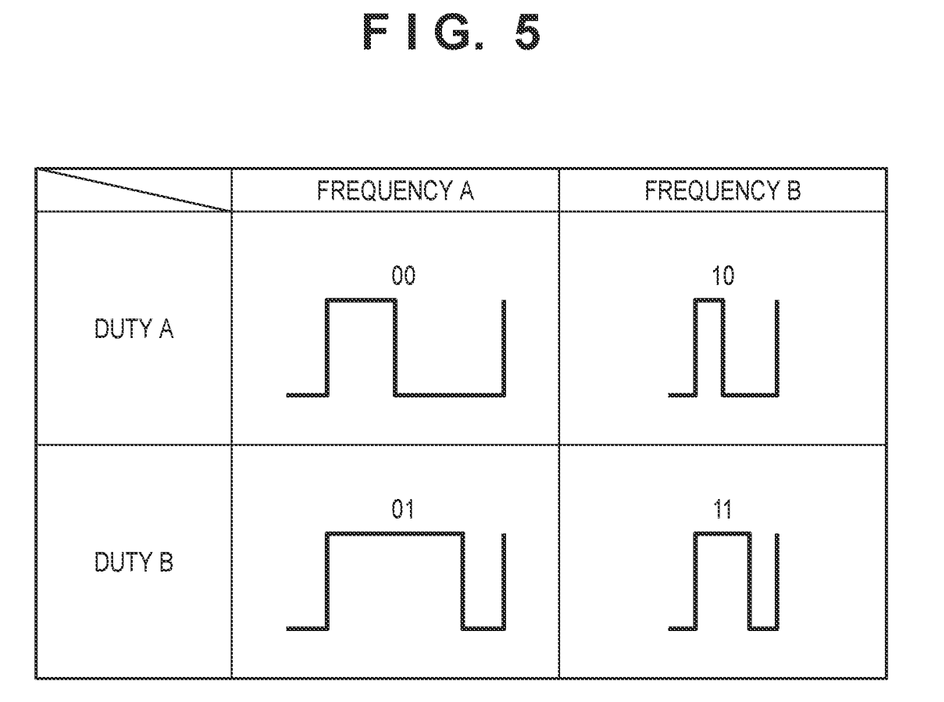
FIG. 5 is a diagram showing the relationship between data values and waveforms of clock pulse signals according to one embodiment.

Next is a description of processing for transmitting the command data by the data carrier drive apparatus 102. The modulation unit 105 of the data carrier drive apparatus 102 generates a clock pulse signal that is modulated according to the data value of the command data when transmitting the command data, in the data transmission state. As described above, the pulse of the clock pulse signal that is output by the pulse signal generation unit 113 is one of four types of pulses, namely, the pulse of the duty A at the frequency A, the pulse of the duty A at the frequency B, the pulse of the duty B at the frequency A or the pulse of the duty B at the frequency B. Also, as described above, the current I is Iy in the data transmission state. Accordingly, as shown in FIG. 3, in the data transmission state, the pulse voltage Vab will be a voltage Vy if the clock pulse signal is high level, and the pulse voltage Vab will be a voltage (Vy−V2) that is lower than the voltage Vy if the clock pulse signal is low level. In other words, the waveform of the pulse voltage Vab is similar to the waveform of the clock pulse signal. In the present embodiment, as shown in FIG. 5, 2-bit data is transmitted by one pulse, using these four types of pulses.

Figure 6:
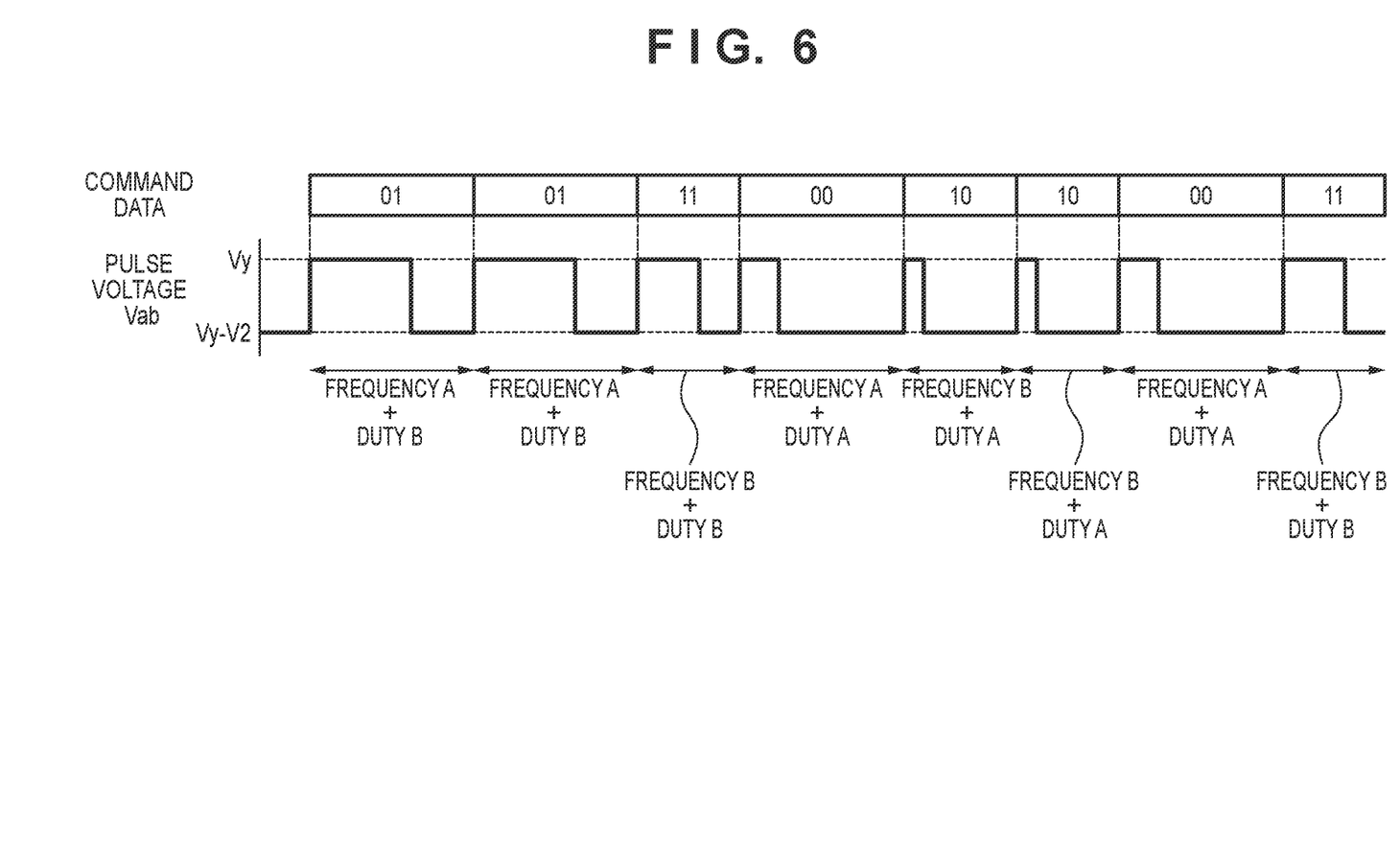
FIG. 6 is a diagram showing a waveform of a pulse voltage that corresponds to command data according to one embodiment.

FIG. 6 shows the pulse voltage Vab in a case where the data carrier drive apparatus 102 transmits command data in which the data string is "0101110010100011". The pulse voltage Vab, which is obtained by the duty ratio and frequency being modulated according to the data value, is applied between the contact A and the contact B of the data carrier apparatus 101. Note that in the present embodiment, the data carrier drive apparatus 102 repetitively transmits data value "01", in states other than the data transmission state. In other words, in states other than the data transmission state, the pulse voltage Vab will be the duty B at the frequency A.

Next is a description of processing for receiving the reply data by the data carrier drive apparatus 102. The data carrier apparatus 101 transmits the reply data to the data carrier drive apparatus 102 by changing the current I that flows in from the data carrier drive apparatus 102. Accordingly, the demodulation unit 106 determines the data value of the reply data by determining the magnitude of the current I. In the present embodiment, if the data value of the reply data is "1", the value of the current I is set to Iy in both the period where the pulse voltage Vab of the data carrier apparatus 101 is high level and the period where this pulse voltage Vab is low level. On the other hand, if the data value of the reply data is "0", the value of the current I is set to Ix, which is greater than Iy, in the period where the pulse voltage Vab of the data carrier apparatus 101 is high level, and the value of the current I is set to Iy in the period where the pulse voltage Vab is low level. Note that the value of the current I is set to Iy while the data carrier apparatus 101 is not transmitting the reply data. In other words, the data carrier apparatus 101 increases the value of the current I in the period in which the pulse voltage Vab is high level to above that in other periods, in the case where a data value "0" is transmitted as the reply data. As described above, due to the voltage drop caused by the current detection resistor Ri of the current detection unit 110, the voltage Va of the terminal A changes depending on the value of the current I that flows into the data carrier apparatus 101 from the data carrier drive apparatus 102. Here, the voltage Va=Vx when the current I is Ix, and if the voltage Va=Vy is set when the current I is Iy, then Vy>Vx. In the present embodiment, the threshold voltage Vth which is generated by the threshold value setting unit 111 dividing the voltage V1 is set to satisfy the relationship Vy>Vth>Vx. As shown in FIG. 4, in the present embodiment, the comparator outputs low level if current I is Ix because the threshold voltage Vth is input to the terminal on the negative side of the comparator. On the other hand, if the current I is Iy, the comparator outputs high level. The determination result from this comparator is input to the data processing unit 103.

Figure 7:
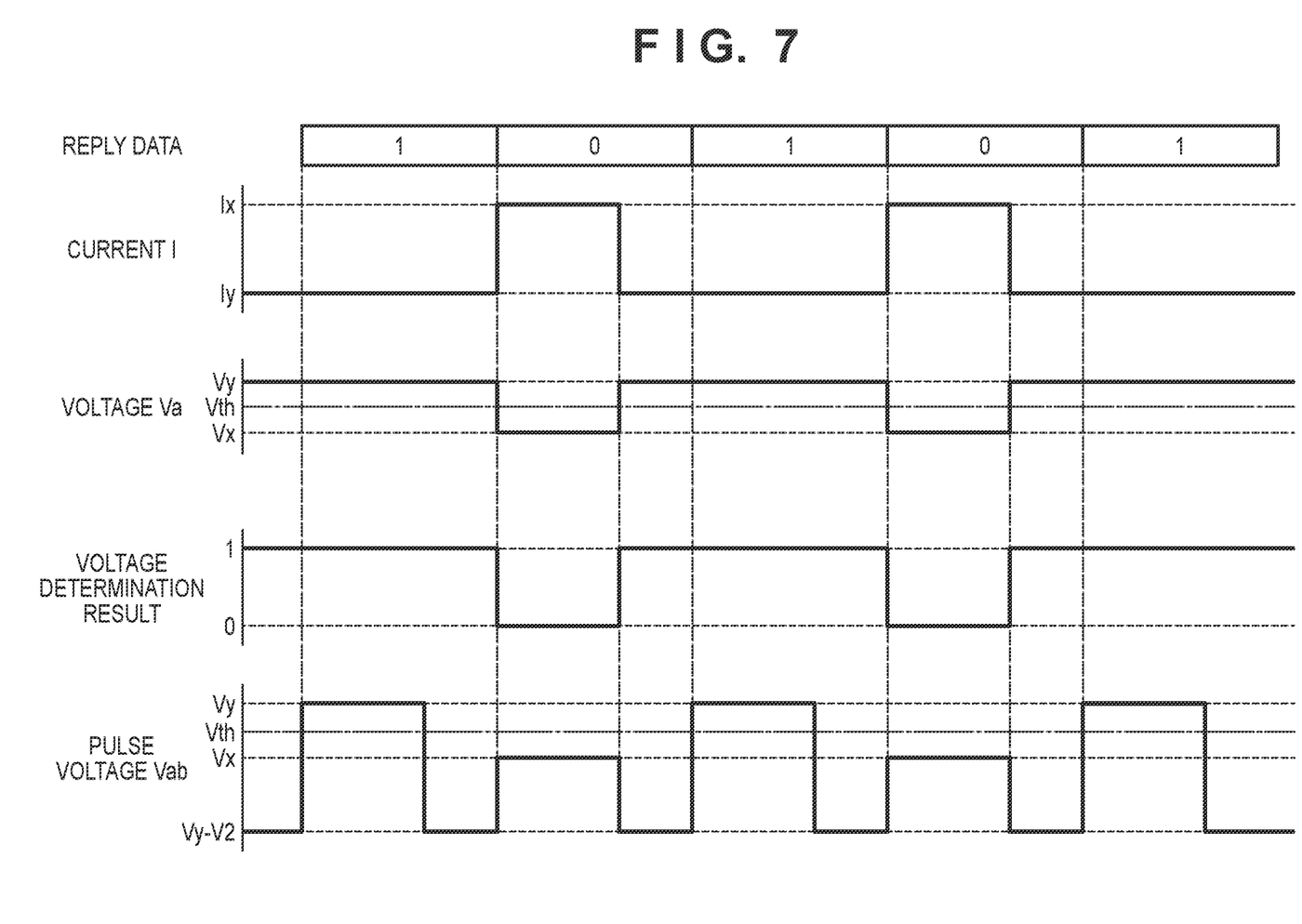
FIG. 7 is a diagram showing signal waveforms according to one embodiment.

FIG. 7 shows waveforms in a case where the data string of the reply data is "10101". The voltage Va will be Vx while the current I is Ix. Accordingly, by comparing the voltage Va to the threshold voltage Vth, the comparator of the current determination unit 109 outputs, to the data processing unit 103, a signal with a waveform indicated as a current determination result in FIG. 7. The data processing unit 103 determines the data value of the reply data based on this waveform from the rising edge of the pulse voltage Vab to the next falling edge. Note that as shown in FIG. 7, the high level value of the pulse voltage Vab also changes according to the reply data because the value of the voltage Va changes according to the value of the current I. Note that as described above, the value of the high level of the pulse voltage Vab only changes when in the data reply state, because the data carrier apparatus 101 sets the current I to Iy in states other than the data reply state. FIG. 2 also shows an example of the relationship between each state and the pulse voltage Vab.

Figure 8:
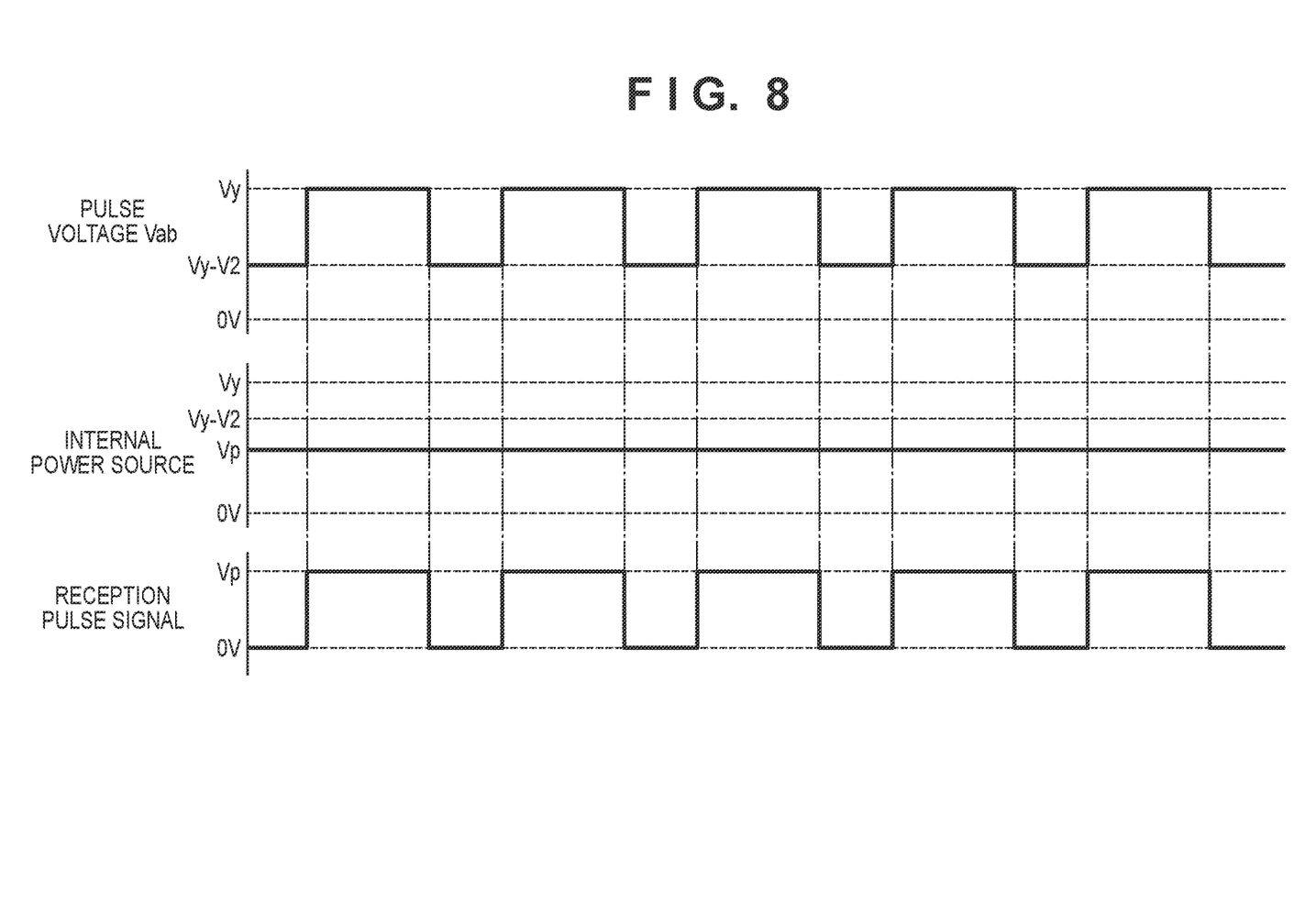
FIG. 8 is a diagram showing signal waveforms according to one embodiment.

Next is a description of the blocks of the data carrier apparatus 101. An internal power source generation unit 118 generates a voltage Vp to be used by the data carrier apparatus 101, based on the pulse voltage Vab that is supplied from the data carrier drive apparatus 102, and supplies the voltage to the units of the data carrier apparatus 101. A conversion unit 124 converts the voltage of the pulse voltage Vab to a value that is usable by logic units in the data carrier apparatus 101. In the present embodiment, the conversion unit 124 converts the voltage of the pulse voltage Vab to the voltage Vp if the pulse voltage Vab is high level, converts the voltage of the pulse voltage Vab to a reference voltage that is lower than the voltage Vp if the pulse voltage Vab is low level, and outputs these voltages to a determination unit 125 as a reception pulse signal. Note that the reference voltage in the present embodiment is 0V. FIG. 8 shows the waveforms when the current I is Iy.

The determination unit 125, in the data transmission state, determines the duty ratio and the frequency of the reception pulse signal and outputs the determination result to a demodulation unit 122. The demodulation unit 122 determines (demodulates) the data value of the command data based on this determination result, and outputs the determined data value to a data processing unit 123. The data processing unit 123 generates reply data based on the contents of the command data and outputs the reply data to a switching unit 117. The switching unit 117 transmits the reply data to the data carrier drive apparatus 102 by switching the current I that flows into the data carrier apparatus 101 from the data carrier drive apparatus 102, according to the data value of the reply data. Also, an internal clock generation unit 116 generates and outputs an internal clock having a frequency that is sufficiently faster than the frequency of the pulse voltage Vab to the determination unit 125.

Next is a detailed description of the determination unit 125. The determination unit 125 has a duty ratio determination unit 120 and a frequency determination unit 121. The frequency determination unit 121 has a preset frequency determination reference value X.

Figure 9:
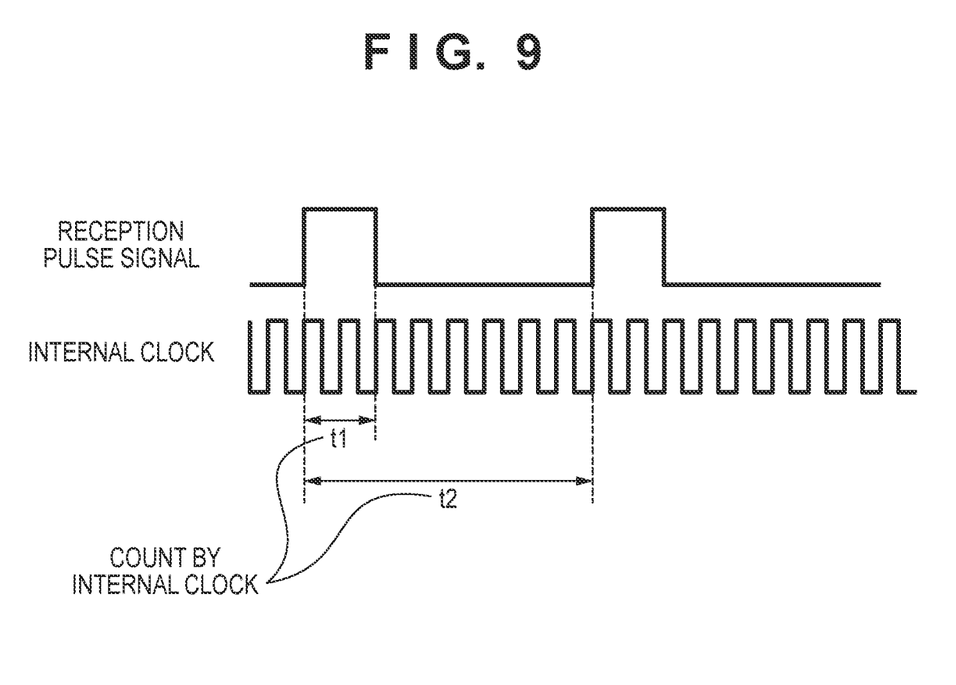
FIG. 9 is an illustrative diagram of processing by a determination unit according to one embodiment.

FIG. 9 is a diagram illustrating the determination processing of the determination unit 125. The determination unit 125 counts a high level period t1 and a pulse period t2 for each pulse of the reception pulse signal, using an internal clock that is sufficiently faster than the reception pulse signal. The duty ratio determination unit 120 compares t1 and a value that is half of t2. As described above, the duty A is smaller than 50% and the duty B is greater than 50%. Accordingly, the duty ratio determination unit 120 determines the duty ratio to be duty A if t1 is smaller than the value that is half of t2, and determines the duty ratio to be duty B if t1 is greater than the value that is half of t2. The duty ratio determination unit 120 outputs the determination result to the demodulation unit 122.

Also, as described above, the frequency B is a higher frequency than the frequency A. Accordingly, the period A of one pulse when the frequency is the frequency A is longer than the period B of one pulse when the frequency is the frequency B. In other words, the value of the period t2 when the reception pulse signal is the frequency A is greater than the value of the period t2 when the reception pulse signal is the frequency B. In the present embodiment, the reference value X stored in the frequency determination unit 121 is smaller than the value of t2 when the reception pulse signal is the frequency A, and is greater than the value of t2 when the reception pulse signal is the frequency B. Accordingly, the frequency determination unit 121 compares t2 and the reference value X, determines the reception pulse signal to be the frequency A if t2 is greater than X, determines the reception pulse signal to be the frequency B if t2 is smaller than X, and outputs the determination result to the demodulation unit 122.

The demodulation unit 122 demodulates the command data based on a combination of the determination results of the duty ratio determination unit 120 and the frequency determination unit 121. Specifically, as shown in FIG. 5, the demodulated data value is determined to be "00" if the determination results are the frequency A and the duty A, to be "01" if the frequency A and the duty B, to be "10" if the frequency B and the duty A, and to be "11" if the frequency B and the duty B. The demodulation unit 122 outputs the demodulated data value to the data processing unit 123.

The following describes detailed operations when the reply data is transmitted to the data carrier drive apparatus 102. The communication state transitions to the data reply state when the interval state ends. In the data reply state, the switching unit 117 of the data carrier apparatus 101 changes the load and switches the magnitude of the current I according to the reply data input from the data processing unit 123. Specifically, as described above, when the reply data is "0", the value of the current I is set to Ix in a period in which the pulse voltage Vab is high level.

As described above, in the present embodiment, the data carrier drive apparatus 102 selects the frequency (period) and the duty ratio based on the data value of a plurality of continuous bits of command data. The data carrier drive apparatus 102 then generates a clock pulse signal that includes pulses having the selected frequency (period) and duty ratio, converts the clock pulse signal with the voltage conversion unit 112 and transmits the resultant signal to the data carrier apparatus 101. Also, the data carrier apparatus 101 generates a reception pulse signal having the same waveform as the clock pulse signal based on the voltage between the two communication lines. The data carrier apparatus 101 then determines the duty ratio of each pulse and the period of each pulse of the reception pulse signal, and determines the data value that is carried by the reception pulse signal based on the determination results of the duty ratio and the period of each pulse. Note that one pulse of the reception pulse signal is the period between rising edges of the reception pulse signal. Also, the reception pulse signal has one falling edge in this period, and the duty ratio is a ratio of the high level period to the period of one pulse.

According to the above configuration, 2-bit command data can be transmitted in one cycle of the pulse voltage Vab. Note that, in the present embodiment, two frequencies (periods) and two duty ratios are used, but a configuration is also possible in which three or more frequencies and three or more duty ratios are combined and a plurality of bits are transmitted in one cycle of the pulse voltage Vab.

Second Embodiment

Figure 10:
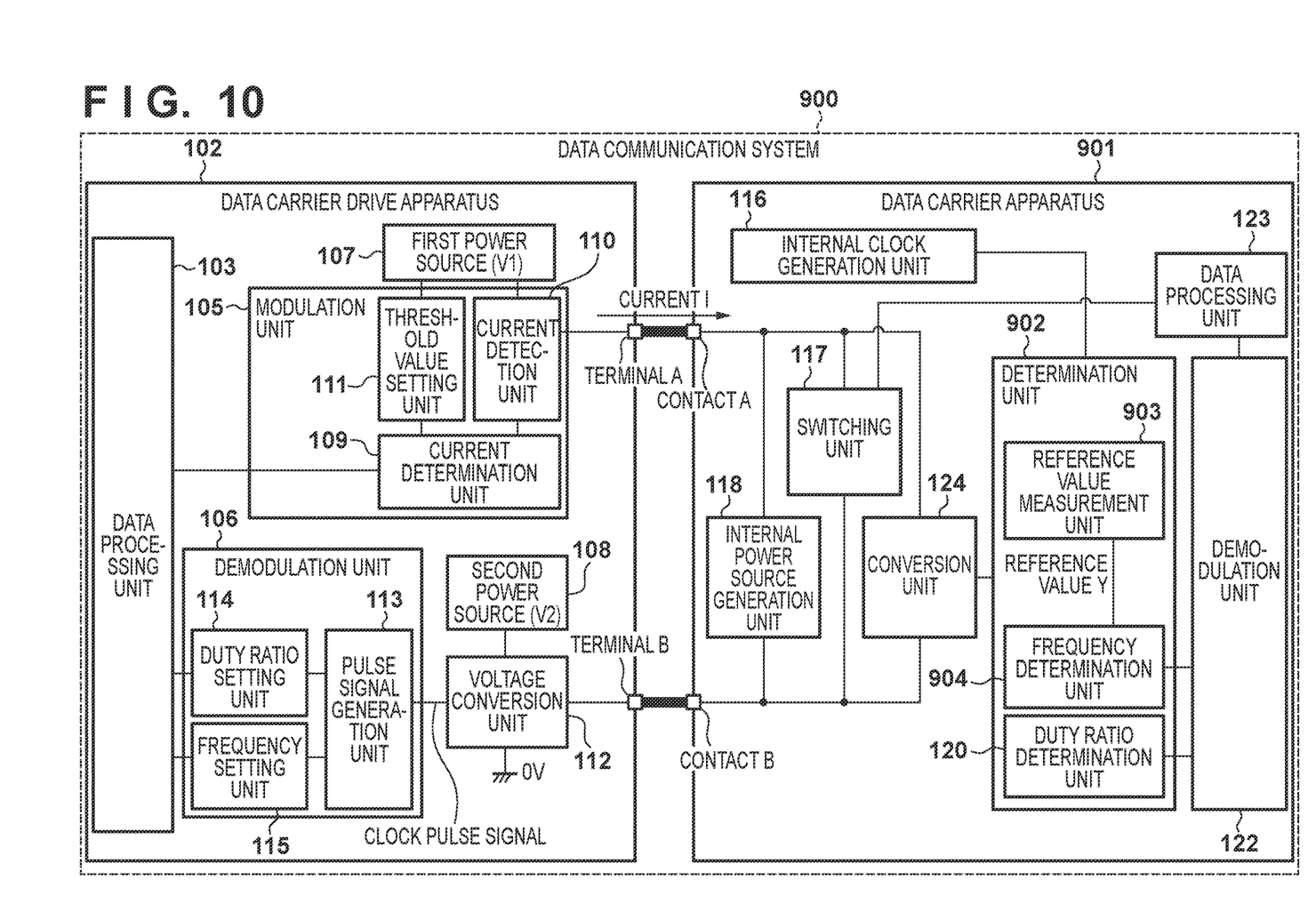
FIG. 10 is a configuration diagram of a data communication system according to one embodiment.

Next, a second embodiment will be described, focusing on the differences from the first embodiment. FIG. 10 is a configuration diagram of a data communication system 900 according to the present embodiment. Note that constituent elements that are similar to those in the first embodiment are given the same reference numerals and descriptions thereof are omitted. The data communication system has a data carrier drive apparatus 102 and a data carrier apparatus 901. Note that the data carrier drive apparatus 102 is similar to that of the first embodiment. In the present embodiment, the data carrier apparatus 901 has a determination unit 902 instead of the determination unit 125 of the first embodiment. Note that the duty ratio determination unit 120 of the determination unit 902 is the same as that of the first embodiment. In the present embodiment, a reference value is not stored in advance in the frequency determination unit 121, unlike the first embodiment. Instead, a reference value measurement unit 903 measures a reference value Y and outputs the reference value Y to a frequency determination unit 904.

Figure 11:
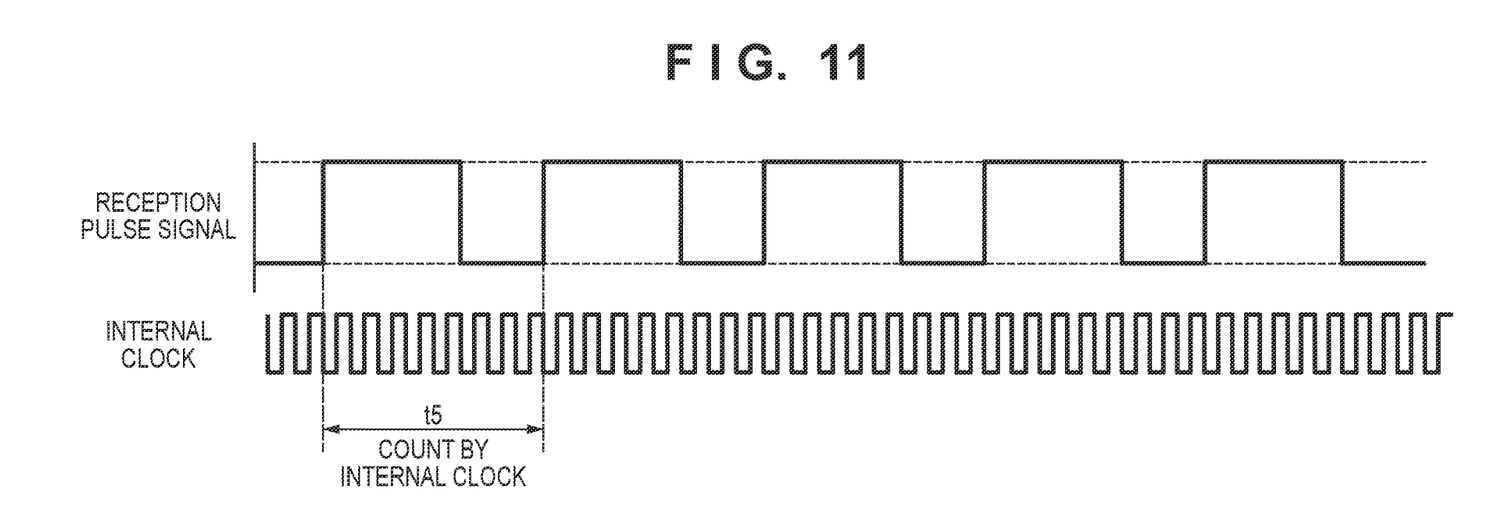
FIG. 11 is an illustrative diagram of reference value measurement processing according to one embodiment.

FIG. 11 is a diagram illustrating the method of measuring the reference value Y by the reference value measurement unit 903. The reference value measurement unit 903 counts one cycle of the reception pulse signal with an internal clock, in the standby state, for example. Note that, as described above, the frequency of the reception pulse signal in the standby state is the frequency A. The reference value measurement unit 903 outputs a count value t5 obtained by counting the period of one pulse when the frequency is the frequency A with the internal clock to the frequency determination unit 904 as the reference value Y.

The frequency determination unit 904, in the data transmission state, derives the absolute value of the difference between the count value t2 of the period of the pulses of the reception pulse signal and the reference value Y, and determines whether the absolute value of this difference is smaller than a predetermined value. As described above, because the reference value Y is the count value of the period of the pulses that correspond to the frequency A, the absolute value of the difference when the reception pulse signal is the frequency A will be smaller than the absolute value of the difference when the reception pulse signal is the frequency B. Accordingly, the frequency determination unit 904, when the absolute value of the difference between the count value t2 of one pulse and the reference value Y is smaller than a predetermined value, determines the frequency of this one pulse to be the frequency A, and, when this is not the case, determines the frequency to be the frequency B. Note that in the present embodiment, the frequency of the reception pulse signal in the standby state is given as the frequency A, but the same applies in the case the frequency B.

A configuration is possible in which measurement of the reference value Y by the reference value measurement unit 903 is only performed in the standby state before initial data communication starts. Also, the reference value Y may be measured every standby state, or the reference value Y may be measured every predetermined number of standby states. Also, only the count value t5 for one pulse may be measured in the standby state and set as the reference value Y, or the count values t5 for a plurality of pulses may be measured and the average value of these count values may be set as the reference value Y.

As described above, in the present embodiment, the data carrier drive apparatus 102 sets the clock pulse signal (period of the pulses) to a constant frequency in periods other than the data transmission state. The data carrier apparatus 101 then measures the period of one or a plurality of pulses and derives the reference value. In this way, in the present embodiment, the reference value Y is measured, and thus it is possible to accurately determine the frequency of the pulses.

Third Embodiment

Figure 12:
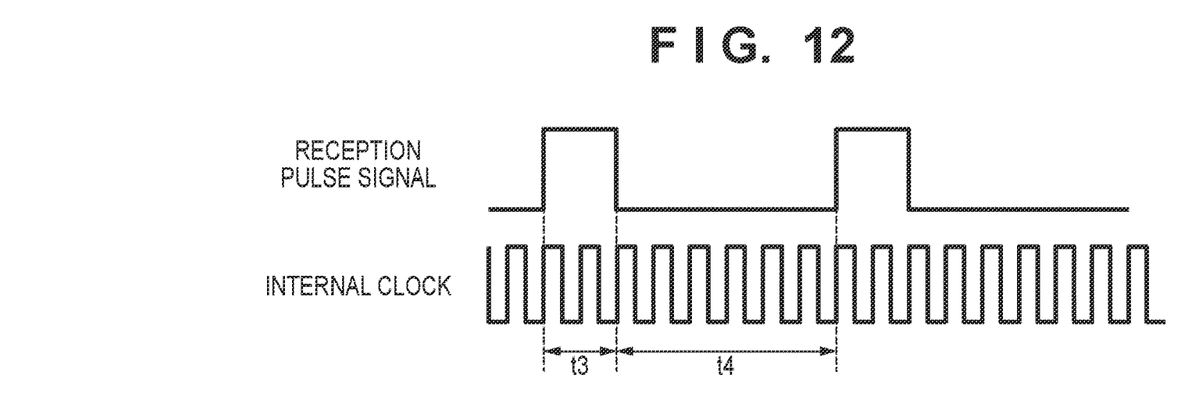
FIG. 12 is an illustrative diagram of processing by the determination unit according to one embodiment.

Next, a third embodiment will be described, focusing on the differences from the first embodiment. Note that the configuration of the present embodiment is similar to the first embodiment that is shown in FIG. 1. In the first embodiment, the determination unit 125 measures the first period t1 from the rising edge to the falling edge of the reception pulse signal, and the second period t2 from the rising edge to the next rising edge with an internal clock. In the present embodiment, as shown in FIG. 12, a period t3 from the rising edge to the falling edge of the reception pulse signal, and a period t4 from the falling edge to the rising edge of the reception pulse signal are measured with an internal clock. In other words, in the present embodiment, the high level period t3 and the low level period t4 of one pulse of the reception pulse signal are measured by an internal clock. Note that because the sum of t3 and t4 is equal to t2 in the first embodiment, the frequency determination unit 121 compares the added value of t3 and t4 to the reference value and determines the frequency. On the other hand, in the present embodiment, the duty ratio determination unit 120 determines the size relationship between the period t3 and the period t4. Specifically, if the period t3 is smaller than the period t4, the frequency determination unit 121 determines the duty ratio to be the duty A, and if the period t3 is greater than the period t4, the frequency determination unit 121 determines the duty ratio to be the duty B.

Note that the data communication system described in the above embodiments can be applied to an image forming apparatus, for example. In such a case, a configuration is possible in which the data carrier drive apparatus is provided on the main body side of the image forming apparatus and the data carrier apparatus is provided in a replaceable part such as a consumable part. The following describes a configuration of the image forming apparatus to which the data communication system of the above embodiments is applied.

Configuration of the Image Forming Apparatus

Figure 13:
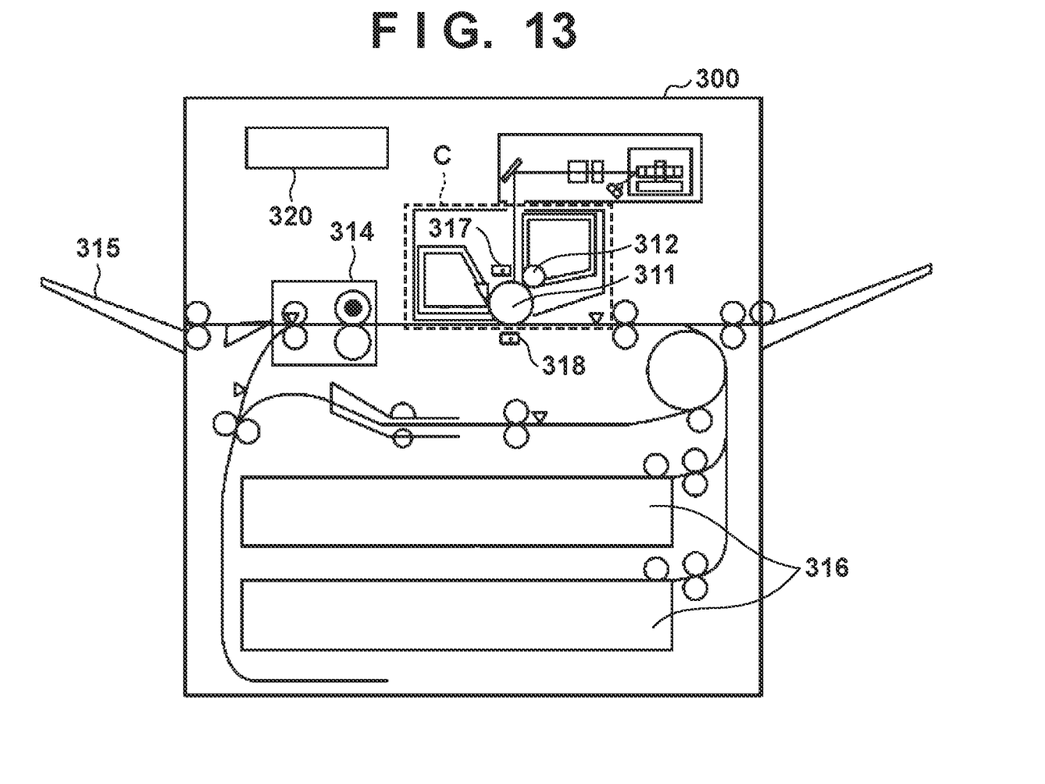
FIG. 13 is a configuration diagram of the image forming apparatus according to one embodiment.

A laser beam printer will be described as an example of the image forming apparatus. FIG. 13 shows a schematic configuration of a laser beam printer that is an example of an electrophotographic printer. A laser beam printer 300 has, as image forming units, a photosensitive drum 311 serving as an image carrier on which an electrostatic latent image is formed, a charging unit 317 that uniformly charges the photosensitive drum 311 and a developing unit 312 that uses toner to develop the electrostatic latent image formed on the photosensitive drum 311. The photosensitive drum 311, the charging unit 317 and the developing unit 312 are removable from the body of the image forming apparatus as an integrated cartridge C. A toner image developed on the photosensitive drum 311 is then transferred, by a transfer unit 318, to a sheet (not shown) serving as a recording material supplied from a cassette 316, and is fixed to the sheet by a fixing device 314. The sheet to which the toner image was fixed is discharged onto a tray 315. Also, the image forming apparatus has a controller 320 that includes a CPU for controlling image forming operations. The controller 320 has a memory (ROM, RAM, etc.; not shown) that stores programs and data for controlling the operations of the image forming apparatus.

Figure 14:
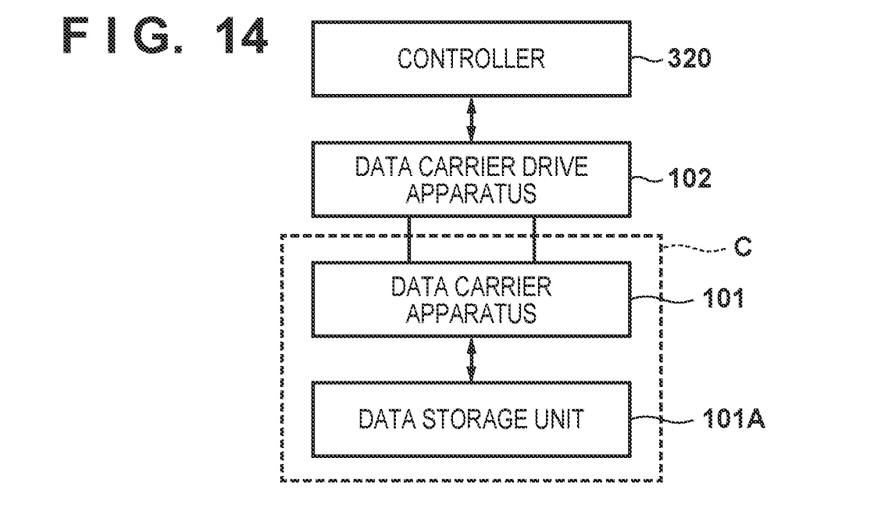
FIG. 14 is a block diagram of a case where a data communication system is applied to an image forming apparatus according to one embodiment.

FIG. 14 is a block diagram of a case where the data communication system is applied to the image forming apparatus. The body of the image forming apparatus is provided with the data carrier drive apparatus 102 that can communicate bidirectionally with the controller 320. The cartridge C has the data carrier apparatus 101 and a data storage unit 101A. Reading out from and writing to the data storage unit 101A is controlled by the data carrier apparatus 101. A nonvolatile memory such as an EEPROM can be used as the data storage unit 101A.

The data carrier drive apparatus 102, based on commands from the controller 320, executes data communication with the data carrier apparatus 101 provided in the cartridge C. The data carrier apparatus 101 of the cartridge C can process data transmitted from the data carrier drive apparatus 102, for example, and store the processed data in the data storage unit 101A. Also, the data carrier apparatus 101, based on a signal from the data carrier drive apparatus 102, can read out data stored in the data storage unit 101A and send the read data to the data carrier drive apparatus 102 as a reply.

In this way, the present invention can be applied to a data communication system in which the data carrier apparatus 101 is provided in a replaceable part of an image forming apparatus. By storing data related to a cartridge serving as a consumable of the image forming apparatus in the data storage unit 101A, a system can be provided that manages the remaining amount of toner and the usage amount of a photosensitive drum as the usage state of the cartridge, for example.

Note that the applicable image forming apparatus is not limited to that shown in FIG. 13, and can be, for example, a color image forming apparatus that has a plurality of image forming units. Also, the replaceable part (replaceable unit) in which the data carrier apparatus 101 is provided is not limited to a cartridge. For example, it is possible to provide a data communication system by providing the data carrier apparatus 101 in a variety of replaceable parts that include a processing member used in image formation, such as an intermediate transfer belt unit that includes an intermediate transfer belt to which the toner image on the photosensitive drum 311 is transferred and a toner unit that stores toner.

OTHER EMBODIMENTS

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-229360, filed on Nov. 29, 2017, and Japanese Patent Application No. 2018-175339, filed on Sep. 19, 2018, which are hereby incorporated by reference herein in their entirety.

What is claimed is:

1. A data carrier apparatus comprising:
   a duty detector configured to determine a duty ratio of each pulse of a pulse signal that is received;
   a frequency detector configured to determine a period of each pulse of the pulse signal; and
   a demodulator configured to determine a value of data being carried by the pulse signal based on a determination result of the duty detector and a determination result of the frequency detector.

2. The data carrier apparatus according to claim 1,
   wherein the period of each pulse of the pulse signal is a period from a first edge at which the pulse signal changes from a first level to a second level to the next first edge, and
   the frequency detector is further configured to determine the period of each pulse by determining the period between the first edges.

3. The data carrier apparatus according to claim 2,
   wherein the frequency detector has a reference value, and is further configured to determine, by comparing the period of one pulse and the reference value, whether the period of the one pulse is a first period or is a second period that is longer than the first period.

4. The data carrier apparatus according to claim 2,
   wherein the frequency detector has a reference value, and is further configured to determine, by determining whether a difference between the period of one pulse and the reference value is smaller than a predetermined value, whether the period of the one pulse is a first period or is a second period that is longer than the first period.

5. The data carrier apparatus according to claim 4,
   wherein the data carrier apparatus is connected to a data carrier drive apparatus by two communication lines, and
   the data carrier apparatus further comprises a converter configured to output the pulse signal based on a potential difference applied between the two communication lines by the data carrier drive apparatus.

6. The data carrier apparatus according to claim 5,
   wherein the period of each pulse of the pulse signal that is output by the converter is the first period or the second period, while the data carrier drive apparatus is not transmitting data, and
   the data carrier apparatus further comprises a measurement instrument configured to measure the reference value based on the pulse signal, while the data carrier drive apparatus is not transmitting data.

7. The data carrier apparatus according to claim 6, wherein the measurement instrument is further configured to measure the reference value by measuring a period of each of one or more pulses of the pulse signal, while the data carrier drive apparatus is not transmitting data.

8. The data carrier apparatus according to claim 2,
   wherein each pulse of the pulse signal has a second edge at which the pulse signal changes from the second level to the first level, and
   the duty detector is further configured to determine, by measuring a period of one pulse and a period of the second level in the one pulse, the duty ratio of the one pulse.

9. The data carrier apparatus according to claim 8, wherein the duty detector is further configured to determine, by comparing a value that is half of the period of one pulse and a period of the second level in the one pulse, whether the duty ratio of the one pulse is a first duty ratio or is a second duty ratio that is greater than the first duty ratio.

10. The data carrier apparatus according to claim 2,
    wherein each pulse of the pulse signal has a second edge at which the pulse signal changes from the second level to the first level, and
    the duty detector is further configured to determine, by comparing a period of the second level in one pulse and a period of the first level in the one pulse, whether the duty ratio of the one pulse is a first duty ratio or is a second duty ratio that is greater than the first duty ratio.

11. A data carrier drive apparatus comprising:
    a selector configured to select a period and a duty ratio, based on a value of data that is to be transmitted; and
    a signal generator configured to generate a pulse signal that includes a pulse having the period and the duty ratio selected by the selector.

12. The data carrier drive apparatus according to claim 11,
    wherein the selector is further configured to, based on a value of continuous 2-bit data, select the period from a first period and a second period that is longer than the first period, and select the duty ratio from a first duty ratio and a second duty ratio that is greater than the first duty ratio.

13. The data carrier drive apparatus according to claim 12, wherein the first duty ratio is smaller than 50% and the second duty ratio is greater than 50%.

14. The data carrier drive apparatus according to claim 12, wherein the signal generator is further configured to generate a pulse signal that includes a pulse having a period of one of the first period and the second period, while data is not transmitted.

15. A communication system comprising a data carrier drive apparatus and a data carrier apparatus that are connected by two communication lines,
    wherein the data carrier drive apparatus includes:
    a selector configured to select a period and a duty ratio, based on a value of data that is to be transmitted, when transmitting data to the data carrier apparatus;
    a signal generator configured to generate a first pulse signal that includes a pulse having the period and the duty ratio selected by the selector; and
    a driver configured to apply a potential difference that depends on the first pulse signal generated by the signal generator to the two communication lines, and
    the data carrier apparatus includes:
    a converter configured to output a second pulse signal based on the potential difference between the two communication lines;
    a duty detector configured to determine a duty ratio of each pulse of the second pulse signal;
    a frequency detector configured to determine a period of each pulse of the second pulse signal; and
    a demodulator configured to determine a value of data transmitted by the data carrier apparatus based on a determination result of the duty detector and a determination result of the frequency detector.

16. A replaceable part of an image forming apparatus, comprising:
   a processing member used for image formation; and
   a data carrier apparatus that is capable of communicating with the image forming apparatus,
   wherein the data carrier apparatus includes:
   a duty detector configured to determine a duty ratio of each pulse of a pulse signal that is received;
   a frequency detector configured to determine a period of each pulse of the pulse signal; and
   a demodulator configured to determine a value of data being carried by the pulse signal based on a determination result of the duty detector and a determination result of the frequency detector.

17. A communication system of an image forming apparatus, comprising:
   a data carrier drive apparatus provided in a body of the image forming apparatus; and
   a data carrier apparatus provided in a replaceable part of the image forming apparatus,
   wherein the data carrier drive apparatus and the data carrier apparatus are capable of communicating with each other through two communication lines,
   the data carrier drive apparatus comprises:
   a selector configured to select a period and a duty ratio based on a value of data that is to be transmitted, when transmitting data to the data carrier apparatus;
   a signal generator configured to generate a first pulse signal that includes a pulse having the period and the duty ratio selected by the selector; and
   a driver configured to apply a potential difference that depends on the first pulse signal generated by the signal generator to the two communication lines, and
   the data carrier apparatus comprises:
   a converter configured to output a second pulse signal based on the potential difference between the two communication lines;
   a duty detector configured to determine a duty ratio of each pulse of the second pulse signal;
   a frequency detector configured to determine a period of each pulse of the second pulse signal; and
   a demodulator configured to determine a value of data transmitted by the data carrier apparatus based on a determination result of the duty detector and a determination result of the frequency detector.

* * * * *